United States Patent
Meck et al.

(12)

(10) Patent No.: US 6,215,355 B1
(45) Date of Patent: Apr. 10, 2001

(54) CONSTANT IMPEDANCE FOR SWITCHABLE AMPLIFIER WITH POWER CONTROL

(75) Inventors: Ronald A. Meck, Soquel; Earl W. McCune, Santa Clara; Lawrence M. Burns, Mountain View, all of CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/416,865

(22) Filed: Oct. 13, 1999

(51) Int. Cl.$^7$ ........................................................ H03F 1/14
(52) U.S. Cl. ............................................... 330/51; 330/311
(58) Field of Search ............................... 330/51, 254, 295, 330/311

(56) References Cited

U.S. PATENT DOCUMENTS

| | | | |
|---|---|---|---|
| 4,134,078 | * 1/1979 | Arai et al. ............................. | 330/254 |
| 4,758,799 | * 7/1988 | Ho et al. ............................... | 330/311 |
| 5,327,097 | * 7/1994 | Igarashi et al. ....................... | 330/254 |
| 5,424,692 | 6/1995 | McDonald ............................. | 333/32 |
| 6,046,640 | * 4/2000 | Brunner ................................ | 330/254 |

\* cited by examiner

*Primary Examiner*—Robert Pascal
*Assistant Examiner*—Henry Choe

(57) ABSTRACT

The present invention, generally speaking, provides an improved power amplifier that minimizes impedance changes as the power amplifier changes from one operational state to another. In an exemplary embodiment, the present power amplifier is based on the well-known cascode amplifier. In a cascode amplifier, a first transistor operates in the common-source (common emitter) configuration to convert the input signal voltage (or current) into an amplified current, and a second transistor operates in the common-gate (common-base) configuration to convert the output current from the first transistor into an output voltage.

6 Claims, 2 Drawing Sheets

CONSTANT IMPEDANCE FOR SWITCHABLE AMPLIFIER WITH POWER CONTROL

BACKGROUND OF THE INVENTION

1. Field of the Invention

The present invention relates to radio frequency (RF) power amplifiers.

2. State of the Art

In many RF communications systems, particularly cellular telephone systems, an RF transmitter portion of an RF transceiver is operated intermittently. In the GSM cellular telephone system, for example, communications are structured on a TDMA (Time Division Multiple Access) basis in which a communications frame comprises some number of timeslots, e.g., eight or sixteen. A particular handset transmits only within its assigned timeslot(s). During the remaining timeslots, the handset does not transmit, meaning that its RF power amplifier is turned off. Hence, the RF power amplifier is repeatedly turned on to transmit during its timeslot and then turned off.

The RF power amplifier is the major consumer of power within a radio transceiver. Unless proper precautions are taken, turning the power amplifier on can create an inrush condition that disturbs other transceiver circuitry. In particular, a PLL (phase lock loop) of the transceiver is susceptible to "frequency pulling" in which turning on the power amplifier disturbs the PLL lock condition. Frequency pulling is not only undesirable but in certain communication systems, such as GSM, is intolerable.

The same problem arises to a lesser degree in connection with power level adjustments. As the distance between a mobile handset and a fixed base station varies, the handset may be commanded to adjust its transmission power upward or downward. Such power control actions may also cause frequency pulling.

Various solutions to the problem of frequency pulling have been proposed.

U.S. Pat. No. 5,424,692 to McDonald, for example, incorporated herein by reference, describes a switchable impedance circuit used at both the input port and the output port of a RF power amplifier. The switchable impedance circuit receives a power down control signal. When the power down control signal is asserted, the switchable impedance circuits switch into alternate impedance states, whereby the "powered down" input impedances at the input and output ports, respectively, appear substantially unchanged in relation to the corresponding "powered up" impedances. In essence, the reference teaches the use of switches in series and shunt along the signal transmission line to selectively connect a through-path or a shunt path.

U.S. Pat. No. 5,774,017 to Adar, incorporated herein by reference, describes an amplifier, operable in two predetermined frequency bands, wherein the input impedance is controlled by using switches to select passive elements in series with the input transmission line. The reference also teaches using shunt switching elements to change interstage matching frequency responses. Since no mention is made of how output power is to be controlled, it appears that the amplifier must operate linearly, with output power being varied by changing the input power applied to the amplifier(s).

There remains a need for an improved power amplifier that further minimizes impedance changes as the power amplifier changes from one operational state to another.

SUMMARY OF THE INVENTION

The present invention, generally speaking, provides an improved power amplifier that minimizes impedance changes as the power amplifier changes from one operational state to another. In an exemplary embodiment, the present power amplifier is based on the well-known cascode amplifier. In a cascode amplifier, a first transistor operates in the common-source (common emitter) configuration to convert the input signal voltage (or current) into an amplified current, and a second transistor operates in the common-gate (common-base) configuration to convert the output current from the first transistor into an output voltage.

Unlike the prior art, the present power amplifier uses no selectable passive elements to set or adjust the input impedance. There are no separate transistors performing series and/or shunt switching functions. Rather, all transistors are integral parts of the actual signal amplifiers. Multiple second cascode transistors may be provided, connected to a single first cascode transistor. By controlling the bias voltage at the common element of these second cascode transistors, one or more of them may be selected to operate on the current supplied by the first cascode transistor.

The input impedance presented by the first cascode transistor is dependent on its bias conditions. With the bias conditions set, the input impedance of the total cascode amplifier remains effectively constant, irrespective of the second cascode transistor(s) that is (are) operating.

The bias of the second cascode transistors may be set so that multiple transistors can operate simultaneously. If only one second cascode transistor is ultimately desired to operate at any particular time, then the control bias can be smoothly transferred from one transistor to the other. Such selectivity is accomplished without the conventional, "snapping" switch action. Sudden transients that are usually not desirable in radio circuitry are thereby avoided.

With the provision for a potentially unlimited number of second cascode transistors, multi-mode and multi-band amplifiers can be constructed. Possibilities include: improving input-to-output isolation by using one load that is connected to no following circuitry; having load networks on separate second cascode transistors tuned to separate frequencies; and so on.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

The present invention is particularly applicable to the use of high efficiency amplifiers, which operate in a highly nonlinear manner. Such nonlinear amplifiers can be controlled to provide a widely varying amount of output power while the input signal is maintained as disclosed in U.S.

patent application Ser. No. 09/247,097 of the present assignee, entitled HIGH EFFICIENCY AMPLIFIER OUTPUT LEVEL AND BURST CONTROL filed on Feb. 9, 1999 and incorporated herein by reference. It is very important that the input impedance of such a power controlled amplifier be maintained constant while the output power varies, so that transients are not excited in the driving circuitry. In the preferred embodiment of the present invention, input impedance is maintained constant within 0.5% over the variation of output power of 95 dB.

Figure 1:
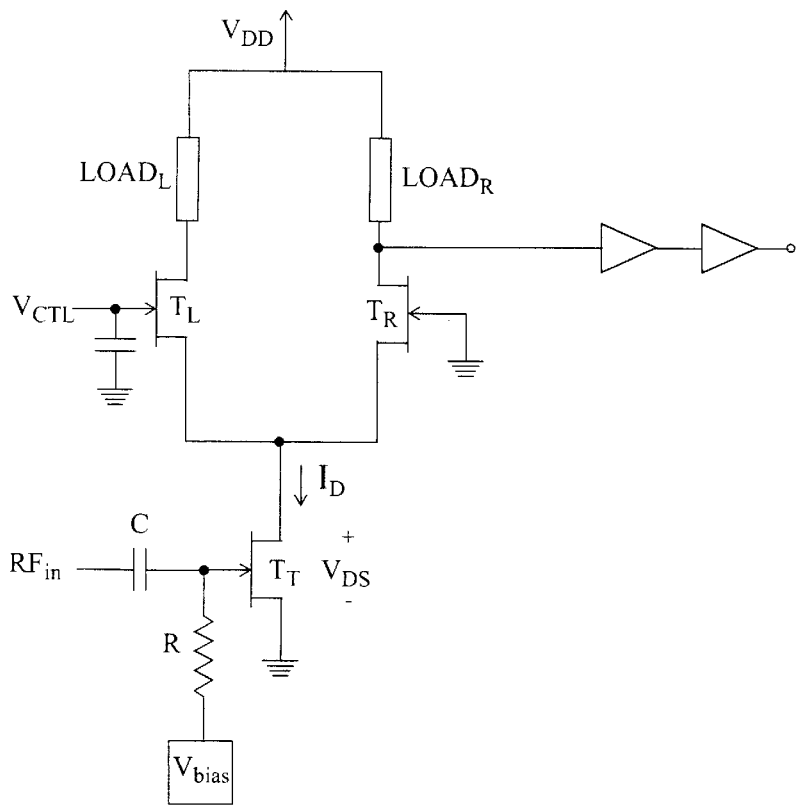
FIG. 1 is a circuit diagram of a controlled impedance input circuit in accordance with an exemplary embodiment of the invention.

Referring now to FIG. 1, a circuit diagram is shown of a power amplifier in accordance with an exemplary embodiment of the invention. A differential transistor pair is provided consisting of transistors $T_L$ and $T_R$. In the illustrated embodiment, the transistors are FETs. In other embodiments, the transistors could be of other types, including bipolar transistors. The source electrodes of the transistors $T_L$ and $T_R$ are connected together, forming the "tail" of the differential pair. The drain electrodes are connected through respective loads $Load_L$ and $Load_R$ to an operating potential.

A third transistor, tail transistor $T_T$, is connected with its drain electrode coupled to source electrodes of the transistors $T_L$ and $T_R$ and its source electrode coupled to a reference voltage.

Thus far, the description of the power amplifier applies equally well to a conventional differential pair. However, the present power amplifier differs dramatically from a conventional differential pair is several respects, to be presently described. In a conventional differential pair, a differential input signal is applied to the control terminals (e.g., gate electrodes) of the differential pair. A fixed bias is applied to the tail transistor, causing a fixed tail current to flow through the differential pair.

In the present power amplifier, by contrast, a control signal, $V_{CTL}$, is applied to the gate electrode of the transistor $T_L$. The gate electrode of the transistor $T_R$ is grounded. Alternatively, the inverse control signal, $\overline{V_{CTL}}$, may be applied to the gate electrode of the transistor $T_R$ as described hereinafter. A quiescent operating point of the tail transistor $T_T$ is set by a bias network including a resistor R and a source of bias potential, $V_{bias}$. The gate of the tail transistor $T_T$ is coupled through the resistor R to the voltage $V_{bias}$. Also applied to the gate of the tail transistor $T_T$ is the input signal $RF_{in}$, which is capacitively coupled through a capacitor C. The output of the circuit is taken at the drain of the transistor $T_R$, which is coupled to one or more amplifier stages.

The transistors $T_T$ and $T_R$ form a cascode amplifier, an amplifier stage composed of (in the case of FETs) a direct-coupled common-source/common-gate combination. The cascode amplifier exhibits very wide bandwidth. In addition, the transistor $T_R$ provides very good isolation between the input and output circuits, effectively eliminating capacitive feedback effects.

In operation, assume that the control signal $V_{CTL}$ is low such that the transistor $T_L$ is turned off. Then only the transistors $T_T$ and $T_R$ belonging to the cascode amplifier are active. In this configuration, the input impedance $Z_{in}$ depends on the voltage across the drain and source (or, in the case of bipolar transistors, collector and emitter) nodes of the transistor $T_T$, and on the current flowing through these nodes. By using the cascode structure in this way, the voltage across the drain and source nodes is maintained effectively constant. The bias circuitry sets the current through these nodes of the first cascode transistor. Thus the input impedance of the total cascode amplifier remains effectively constant.

Now, as the control signal $V_{CTL}$ is raised, the transistor $T_L$ will begin to conduct and, if raised to a sufficient positive level, will conduct more than the transistor $T_R$ until the transistor $T_R$ eventually turns off. A differential action occurs, but with respect to the control signal $V_{CTL}$, not the RF signal itself. The differential action is used to control through which leg of the differential stage the tail current flows and hence which of the associated cascode RF stages are powered up and which are powered down.

Figure 2:
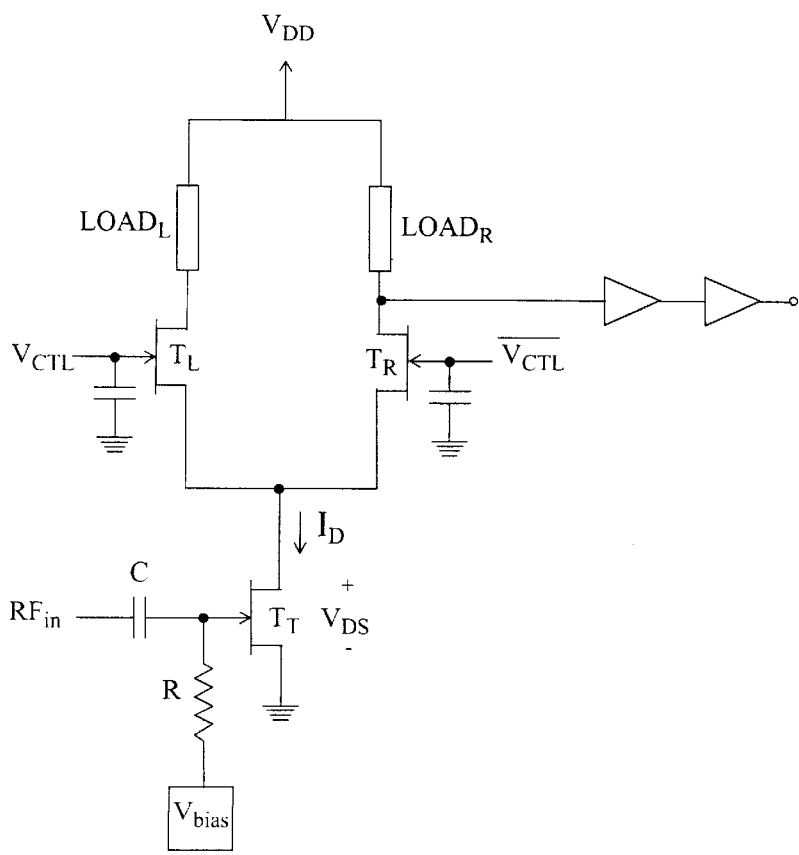
FIG. 2 is a circuit diagram showing a variation of the circuit of FIG. 1.

If the gate of the transistor $T_R$ is grounded, then the input impedance $Z_{in}$ will vary slightly depending on the state of the control signal $V_{CTL}$. Alternatively, the inverse control signal, $\overline{V_{CTL}}$, may be applied to the gate electrode of the transistor $T_R$ as illustrated in FIG. 2. In this arrangement, variations in the input impedance are negligible.

Multiple second cascode transistors may be provided, connected to a single first cascode transistor. By controlling the bias voltage at the common element of these second cascode transistors, one or more of them may be selected to operate on the current supplied by the first cascode transistor.

The input impedance presented by the first cascode transistor is dependent on its bias conditions. With the bias conditions set, the input impedance of the total cascode amplifier remains effectively constant, irrespective of the second cascode transistor(s) that is (are) operating.

The bias of the second cascode transistors may be set so that multiple transistors can operate simultaneously. If only one second cascode transistor is ultimately desired to operate at any particular time, then the control bias can be smoothly transferred from one transistor to the other. Such selectivity is accomplished without the conventional, "snapping" switch action. Sudden transients that are usually not desirable in radio circuitry are thereby avoided.

With the provision for a potentially unlimited number of second cascode transistors, multi-mode and multi-band amplifiers can be constructed. Possibilities include: improving input-to-output isolation by using one load that is connected to no following circuitry; having load networks on separate second cascode transistors tuned to separate frequencies; and so on. Different ones of these possibilities are illustrated in FIG. 3 and FIG. 4, respectively.

Figure 3:
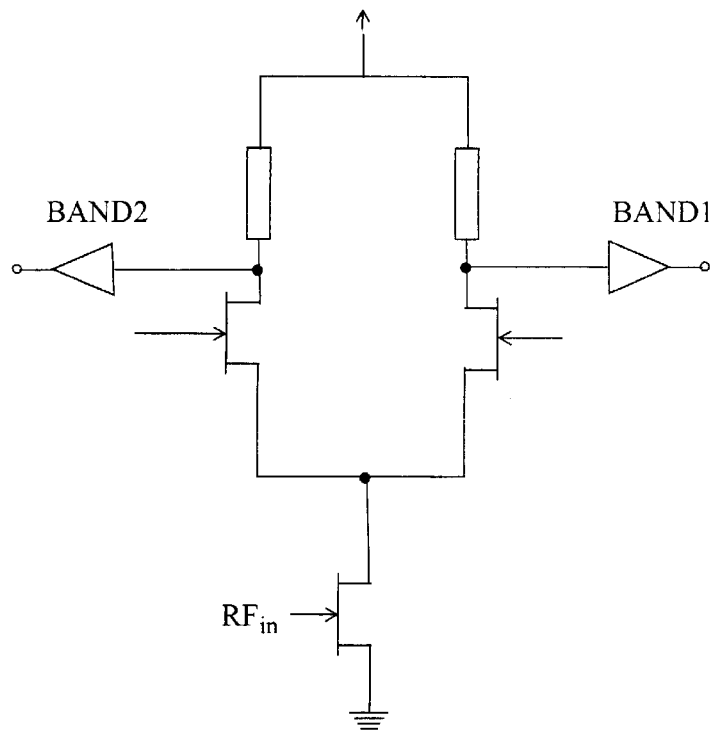
FIG. 3 is a circuit diagram showing a multi-band amplifier circuit.

Referring to FIG. 3, an amplifier circuit having two legs is provided. Within each leg, a power amplifier is connected to receive as an input voltage the voltage developed across the load. The power amplifiers of the two legs are optimized for different frequency bands, Band 1 and Band 2, respectively.

Figure 4:
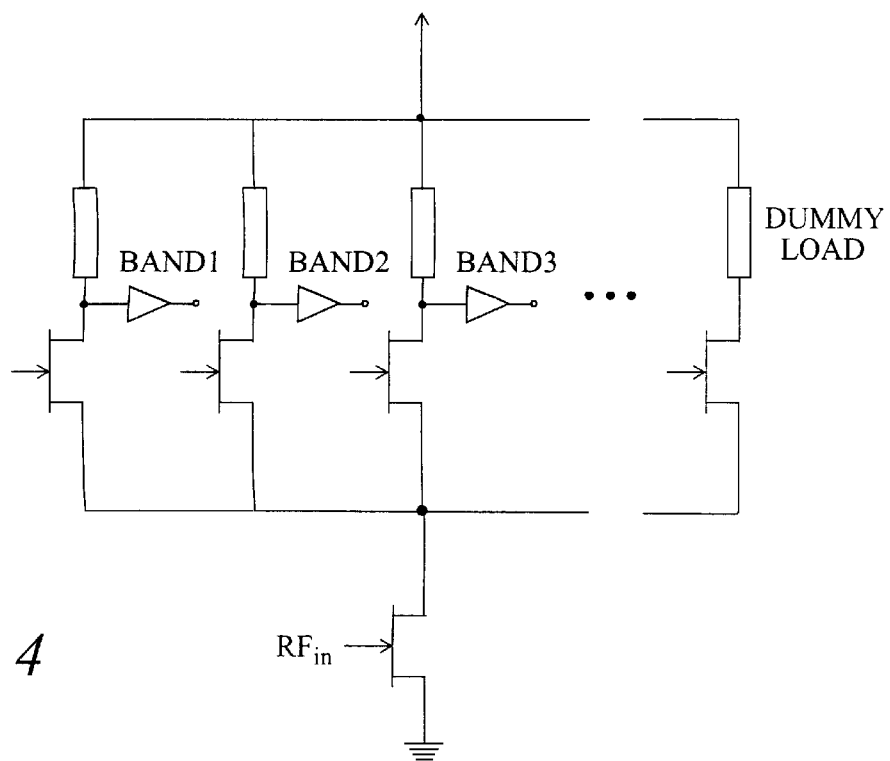
FIG. 4 is a circuit diagram showing another embodiment of the invention.

Referring to FIG. 4, an amplifier circuit having more than two legs is provided. Multiple bands are provided for in like manner as in FIG. 3. In addition, a load of one of the legs of the differential amplifier circuit serves as a dummy load; i.e., one load is connected to no following circuitry. When this leg of the differential amplifier circuit is selected, there results an isolation mode in which the RF input is isolated from downstream amplifying circuitry that produces the final RF output.

In other embodiments, the RF stages associated with different legs of the differential amplifier may be coupled to different antennas, providing transmit diversity. The present controlled impedance input circuit provides a convenient and efficient way to switch between antennas, by switching at the early stages of amplification instead of switching a high-power signal.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A wideband controlled impedance input circuit for an RF power amplifier, comprising:

switching elements connected so as to form a amplifier stage, including a first switching element connected in one leg of the amplifier stage, a second switching element connected in another leg of the amplifier stage, and a third switching element connected in a tail circuit of the amplifier state;

a bias circuit connected to the third switching element to establish a quiescent operating point thereof;

a control signal a form of which is applied to at least one of the first and second switching elements;

an RF input signal applied to the third switching element;

a first load element connected in series with the first switching element at a first circuit node;

a second load element connected in series with the second switching element; and a RF amplifier stage connected to the first circuit node;

wherein, when the control signal transitions from one state to another state, the RF amplifier stage transitions from one of a powered-up state and a powered-down state to the opposite state, an input impedance of the input circuit remaining substantially constant by operation of the bias circuit.

2. The apparatus of claim 1, wherein the control signal is slew-rate limited so as to transition gradually from one state to another.

3. The apparatus of claim 1, wherein the second load element is a dummy load element in that a voltage developed across the dummy load element is not used to drive a further active component.

4. The apparatus of claim 1, wherein the amplifier stage comprises a number of legs greater than two.

5. The apparatus of claim 4, wherein at least two of the legs of the amplifier stage each comprises a load element in series with a switching element at a circuit node, and an RF amplifier stage connected to the circuit node.

6. The apparatus of claim 5, wherein one RF amplifier stage operates in a first frequency band, and a second RF amplifier stage operates in a second different frequency band.

* * * * *